United States Patent [19]

Bolmgren

[11] 3,743,861

[45] July 3, 1973

[54] THYRISTOR HARD-FIRING CIRCUIT

[75] Inventor: Lester N. Bolmgren, Richfield, Minn.

[73] Assignee: Honeywell Inc., Minneapolis, Minn.

[22] Filed: Nov. 26, 1971

[21] Appl. No.: 202,421

[52] U.S. Cl. ........... 307/252 B, 307/252 J, 307/268

[51] Int. Cl. .......................................... H03k 17/72

[58] Field of Search .................... 307/252 B, 252 N, 307/252 J, 252 JA, 268

[56] References Cited

UNITED STATES PATENTS

| | | | |
|---|---|---|---|
| 3,582,685 | 6/1971 | Bolmgren | 307/252 N |
| 3,446,993 | 5/1969 | Graham | 307/252 N |

*Primary Examiner*—John Zazworsky
*Attorney*—Lamont B. Koontz et al.

[57] ABSTRACT

A gating circuit for a load controlling triac which comprises an alternating current source, a filter network for providing a DC voltage, a switch which will prevent gating signals being applied to the triac until a predetermined level of voltage has been established by the filter circuit, and a second switch for disconnecting the filter circuit from the first switch whenever the alternating current is disconnected from the filter network whereby the gating circuit insures that the gating signals supplied to the triac are of sufficient magnitude to prevent damage to that triac.

7 Claims, 1 Drawing Figure

Patented July 3, 1973 3,743,861
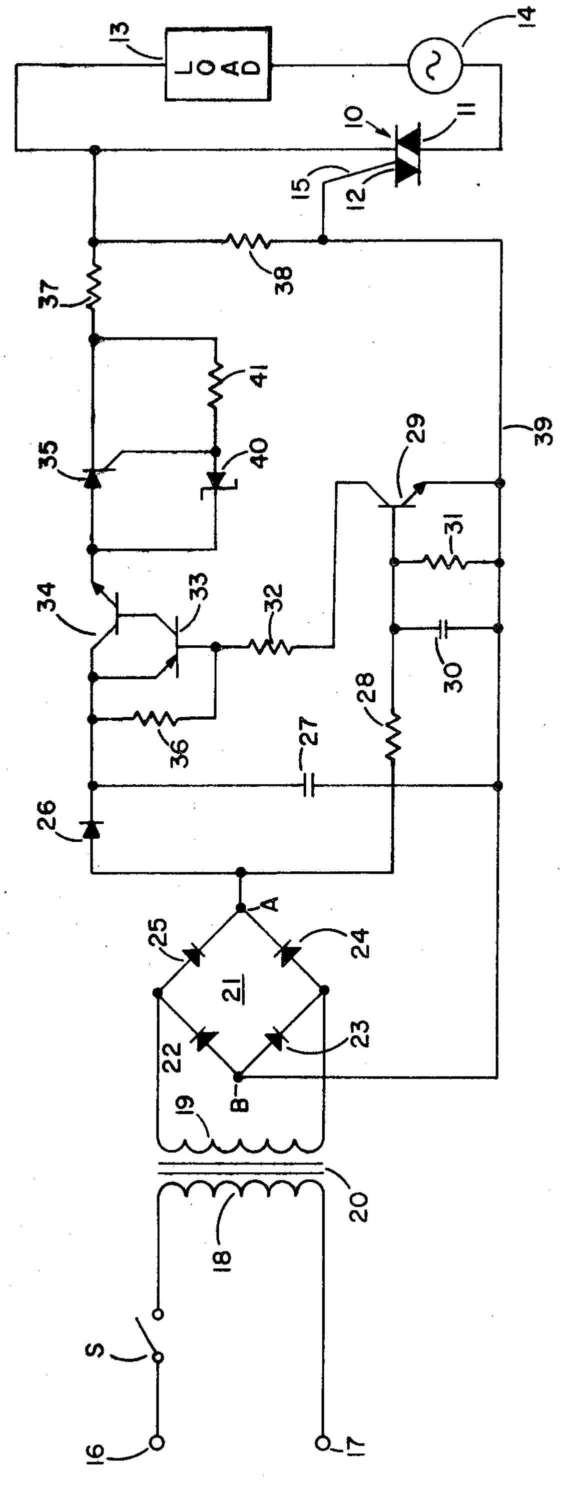
INVENTOR.
LESTER N. BOLMGREN
BY Osmund R. Dahle
ATTORNEY.

THYRISTOR HARD-FIRING CIRCUIT

In controlling the application of large currents to a load, various switching devices have been utilized. In recent years, triacs having large power handling capabilities have been constructed for this use. However, the use of such triacs has a serious drawback. If the gating pulse supplied to such a triac is too small, the triac will conduct the large currents over only part of its current carrying region causing the triac to burn out. Large power SCRs and transistors suffer the same problem.

The present invention is designed to prevent such destruction of large power triacs, SCRs, and transistors by insuring that the gating pulses are always of a sufficiently large magnitude to cause the triac to conduct over all of its current carrying region. More particularly, the invention comprises a DC voltage obtained by filtering a fullwave rectified alternating voltage. A voltage responsive switch is connected between the filter DC voltage and the gate of the thyristor to insure that gating pulses are not supplied to the thyristor unless they are of a sufficient magnitude.

Since this voltage responsive switch comprises an S.C.R., however, it will not cease conducting until the voltage applied thereto has decreased to a minimum value. Since this minimum value is of such a nature as to cause the power thyristor to conduct over only part of its current carrying region, a second switch is incorporated into the circuit to disconnect the filter voltage from the voltage responsive switch whenever the fullwave rectified voltage is disconnected from the filter circuit. Thus, when voltage is first applied to the filter circuit, the DC voltage cannot be applied to the thyristor until the voltage is of a predetermined magnitude. Whenever the voltage is disconnected from the filter circuit, the filter voltage is prevented from gating the triac regardless of the magnitude of the filter voltage.

The single FIGURE is a schematic circuit diagram of a triac gating circuit in accordance with the present invention.

The triac is shown generally at 10 and comprises power control terminals 11 and 12 which connect the load 13 to the power source 14. The triac further comprises a gate terminal 15.

Gating pulses supplied to the gate 15 of the triac 10 are derived from a gating circuit comprising input terminals 16 and 17 which are connected to a source of alternating current. Terminal 16 and 17 are connected to the primary winding 18 of step-down isolation transformer 20. Transformer 20 has a secondary winding 19 for supplying an alternating current voltage to fullwave rectifying bridge 21. Bridge 21 comprises diodes 22-25 and has its output taken across terminals A and B. Terminal A is connected through diode 26 to one side of filter capacitor 27 the other side of which is connected back to terminal B. Filter capacitor 27 acquires a DC voltage whenever switch S is closed.

Terminal A of bridge 21 is also connected through resistor 28 to the base of transistor 29, the emitter of which is connected back to terminal B of bridge 21. Capacitor 30 and resistor 31 are connected from the base to the emitter of transistor 29. The collector of transistor 29 is connected through a resistor 32 to the base of a PNP transistor 33, the emitter of which is connected to the junction of diode 26 and capacitor 27 whereas the collector of transistor 33 is connected to the base of NPN transistor 34. The collector of transistor 34 is connected to the junction of diode 26 and capacitor 27 whereas the emitter is connected to one power terminal of SCR 35. The junction of diode 26 and capacitor 27 is also connected through a resistor 36 to the base of transistor 33. The other power terminal of SCR 35 is connected through resistor 37 and resistor 38 to line 39 which is connected between terminal B of bridge 21 and gate 15 of triac 10. Connected in parallel to the power terminals of SCR 35 are a zener diode 40 and a resistor 41. The gate of SCR 35 is connected to the junction of the zener diode and resistor 41. Finally, the junction of resistors 37 and 38 is connected to terminal 12 of triac 10.

In operation, assume that the capacitor 27 has no charge thereacross just prior to the closing of switch S. Upon the closure of switch S, AC is connected through the transformer 20 to bridge 21. The fullwave rectified pulsating AC voltage appearing across terminals A and B is applied through diode 26 to capacitor 27 to establish a DC voltage thereacross. At the same time, the voltage across terminals A and B is applied to the base to emitter circuit of transistor 29 which will cause the transistor to conduct beginning with a predetermined phase angle in each half wave of the current cycle. When transistor 29 begins to conduct, current is pulled down through the base circuit of transistor 33 turning on that transistor. When transistor 33 begins to conduct, transistor 34 conducts and the DC voltage established by the filter capacitor 27 is connected to the SCR circuit 35. However, SCR 35 will not conduct until the zener breakdown potential has been reached.

The triac 10, therefore, cannot be gated on until the zener breakdown voltage has been attained. As a result, when the filter voltage is large enough, the triac 10 can be gated on such that it will conduct over its entire current carrying region.

When the triac 10 conducts, power from source 14 is applied to load 13. When the triac 10 is to be deactivated, switch S is opened. Without the use of transistors 29, 33, and 34, the voltage across capacitor 27 would begin to slowly decrease. However, the SCR 35 would conduct until its turn-off voltage, which is quite small, is attained. Thus, the SCR 35 would allow small gating signals to be applied to the triac 10 resulting in damage to the triac because of its conducting over an inadequate portion of its current carrying region. However, with transistors 29, 33, 34 in the circuit, when switch S is opened, the turn-on signal to the base-emitter circuit of transistor 29 ceases. Therefore, transistor 29 ceases conduction and results in the nonconduction of transistors 33 and 34. Therefore, as soon as switch S is open, all gating signals are taken away from gate 15 of triac 10 thereby presenting insufficient gating pulses from reaching the triac.

The embodiments of the invention in which an exclusive property or right is claimed are defined as follows:

1. A hard-firing gating circuit for controlling the energization of an output switching device wherein said device is adapted to control the application of power to a load, said circuit comprising:

an output switching device having at least two power terminals and a gate terminal, said power terminals adapted, upon energization of said device, to connect a source of power to a load:

input terminal means for supplying a pulsating voltage a source of direct current voltage;

switch means having a gate terminal connected to said input terminal means for receiving said pulsating voltage, an input power terminal connected to said source of direct current voltage, and an output terminal, said direct current voltage appearing upon said output terminal upon energization of said switch means;

potential responsive means comprising an SCR having a gate terminal, a first power terminal connected to said output terminal of said switch means and having a second power terminal and further comprising a zener diode connected between said output terminal of said switch means and said gate of said SCR, said direct current voltage from said source of direct current voltage appearing upon said second power terminal of said SCR upon conduction of said potential responsive means; and, means connecting said potential responsive means to said gate terminal of said output switching device.

2. A gating circuit as set forth in claim 1 wherein said output switching device comprises a semi-conductor switching means.

3. A gating circuit as set forth in claim 2 wherein said source of direct current voltage comprises a filter circuit connected across said input terminal means.

4. A gating circuit as set forth in claim 3 wherein said switch means comprises first transistor means responsive to said pulsating voltage and second transistor means for conducting in response to the conduction said first transistor means.

5. A gating circuit as set forth in claim 1 wherein said output switching device comprises a triac.

6. A gating circuit as set forth in claim 5 wherein said source of direct current voltage comprises a filter circuit connected across said input terminal means, said filter circuit further comprising a capacitor, and wherein said switch means comprises a first transistor means connected to said input terminal means and second transistor means responsive to the conduction of said first transistor means and connected between said capacitor and said potential responsive means.

7. A hard-firing gating circuit for controlling the energization of an output switching device wherein said device is adapted to control the application of power to a load, said circuit comprising:

an output switching device having at least two power terminals and a gate terminal, said power terminals adapted, upon energization of said device, to connect a source of power to a load:

input terminal means for supplying a pulsating voltage;

a source of direct current voltage comprising a capacitor and a diode, said diode connecting said input terminal means to said capacitor, said capacitor developing a direct current voltage thereacross;

switch means having a gate terminal connected to said input terminal means for receiving said pulsating voltage, an input power terminal connected to said capacitor, and an output terminal, said direct current voltage appearing upon said output terminal upon energization of said switch means;

potential responsive means having an input connected to said output terminal of said switch means and an output, said direct current voltage from said capacitor appearing upon said output upon conduction of said potential responsive means; and, means connecting said potential responsive means to said gate terminal of said output switching device, whereby said potential responsive means establishes a break-down potential for preventing connection of said source of direct current voltage to said gate terminal of said output switching device until said source of direct current voltage is sufficiently large to turn on said device without damage thereto.

* * * * *